United States Patent [19]
Bronstein-Bonte et al.

[11] Patent Number: 4,629,821
[45] Date of Patent: Dec. 16, 1986

[54] PHOTOVOLTAIC CELL

[75] Inventors: Irena Y. Bronstein-Bonte, Newton; Alan B. Fischer, Cambridge, both of Mass.

[73] Assignee: Polaroid Corporation, Cambridge, Mass.

[21] Appl. No.: 775,676

[22] Filed: Sep. 13, 1985

Related U.S. Application Data

[63] Continuation-in-part of Ser. No. 641,306, Aug. 16, 1984, abandoned.

[51] Int. Cl.⁴ .............................................. H01L 31/06
[52] U.S. Cl. ..................................... 136/257; 136/247
[58] Field of Search ........................ 136/247, 257, 259

[56] References Cited

U.S. PATENT DOCUMENTS

| 3,309,226 | 3/1967 | Weisbeck et al. | 428/413 |
| 3,935,031 | 1/1976 | Adler | 136/264 |
| 4,088,508 | 5/1978 | Gravisse | 136/257 |
| 4,492,648 | 1/1985 | Claussen | 252/582 |

Primary Examiner—Aaron Weisstuch

[57] ABSTRACT

Novel photovoltaic cell systems, particularly silicon cells, for converting electromagnetic radiation into electric energy, wherein a luminescent medium or reagent which will absorb radiation at the shorter wavelengths, e.g. the UV, and emit it at longer wavelengths is disposed between the light source and the cell to increase its efficiency, the essence of the invention being the use of a class of anthracene dimer derivatives known in the literature as lepidopterenes as the luminescent medium or reagent. The structural formula for the lepidopterenes is shown in FIG. 1.

12 Claims, 6 Drawing Figures

PHOTOVOLTAIC CELL

CROSS REFERENCE TO OTHER APPLICATIONS

This application is a continuation-in-part of copending application Ser. No. 641,306, filed Aug. 16, 1984, now abandoned.

BACKGROUND OF THE INVENTION

In recent years much attention has focused on the use of photovoltaic cells to convert electromagnetic radiation into electric energy. Of particular interest are the various potential usages of solar energy as the source of electricity.

While various forms of photovoltaic cells (often called solar cells) are known, in general they can be described as semiconductor devices which are capable of converting sunlight directly into electricity. Photovoltaic installations will generally consist of small, individual generating units—the photovoltaic cell.

In their early inception they found numerous uses in electronic and aerospace applications. It is surprising that such a large variety of these cells are available today or in advanced development when one considers that it has only been since about 1972 that serious attention has been given to designing cells for use in anything other than spacecraft. Devices are available with a large range of efficiencies and voltages. Some cells are designed to withstand high solar intensities and high operating temperatures, while others are designed to minimize manufacturing costs.

With photovoltaic cells, the energy in light is transferred to electrons in a semiconductor material when a light photon collides with an atom in the material with enough energy to dislodge an electron from a fixed position in the material (i.e. from the valence band), giving it enough energy to move freely in the material (i.e. into the conduction band). A vacant electron position or "hole" is left behind at the site of this collision. Such holes can move if a neighboring electron leaves its site to fill the former hole site. A current is created if these pairs of electrons and holes (which act as positive charges) are separated by an intrinsic voltage in the cell material.

Creating and controlling this intrinsic voltage is the trick which has made semiconductor electronics possible. The most common technique for producing such a voltage is to create an abrupt discontinuity in the conductivity of the cell material (typically silicon in contemporary solid state components) by adding small amounts of impurities or dopants to the pure material. This is called a homojunction cell. An intrinsic voltage can also be created by joining two dissimilar semiconductor materials creating a heterojunction, or by joining semiconductor to metal (e.g. amorphous silicon to palladium), creating a Schottky barrier junction.

A fundamental limit on the performance of all of these devices results from the fact that: (1) light photons lacking the energy required to lift electrons from the valence to the conduction bands (the band gap energy) cannot contribute to photovoltaic current; and (2) the energy given to electrons which exceeds the minimum excitation threshold cannot be recovered as useful electrical current. Most of the unrecovered photon energy is dissipated by heating the cell.

The bulk of the solar energy reaching the earth's surface falls in the visible spectrum where photon energies vary from 1.8 eV (deep red) to 3 eV (violet). In silicon, only about 1.1 eV is required to produce a photovoltaic electron. Choosing a material with a higher energy threshold results in capturing a larger fraction of the energy in higher energy photons but losing a larger fraction of lower energy photons. The theoretical efficiency peaks at approximately 1.5 eV, but the theoretical efficiency remains within 80% of this maximum for materials with band gap energies between 1 and 2.2 eV.

In the evolution of photovoltaic cells, e.g. since the early '70's, the art has been confronted with various problems affecting the efficiency of the cells, all of which need not be discussed herein.

The present invention relates to one of these problems, namely that the usual photovoltaic cells have a sensitivity curve which is limited in a spectrum zone of longer wavelengths. For instance, it is well established in the art that among existing photovoltaic devices, a single crystal silicon photovoltaic cell (sometimes referred to simply as a "silicon cell") provides the highest conversion efficiency of solar energy radiation into electrical energy. However, the problem with the silicon cell in the past has been its relatively low conversion efficiency of 10 to 15 percent in direct sunlight. One of the reasons for this low conversion efficiency is that the specific spectral energy of solar radiation does not provide a good spectral match with the response of a silicon cell.

In attempts to solve this problem, efforts have focused on the fact that it would be advantageous to make use of spectrum regions other than those of high wavelengths and which are endowed with greater energy, e.g. violet, near ultraviolet and remote ultraviolet. Accordingly, efforts have been made in the past to increase the overall efficiency of solar energy collectors and photovoltaic cells, specifically, by disposing between the source of actinic radiation and the cell a luminescent medium or reagent which will absorb radiation at the shorter wavelengths, e.g. the UV, and emit it at longer wavelengths to which the cell is responsive to conversion to electrical energy.

For example, U.S. Pat. No. 3,912,931 issued to Gravisse et al on Oct. 14, 1975 relates to a photovoltaic device having a large surface for receiving radiation having a coating containing at least one luminescent substance so chosen that the response to spectral excitation of the substance is, on the average, situated lower, on the scale of the wavelengths, than the zone of spectral sensitivity of the photovoltaic cell alone. More specifically, the patent discloses a type of solar cell construction which contains a series of thin luminescent layers of different compositions, which are laid over the surface of the photovoltaic cell, the order of succession and the composition of these layers being selected in such manner that the light energy, in a spectrum zone, falling upon the outermost thin layer is transferred in cascade, through the intermediary of the interposed individual layers, to the spectral sensitivity zone of the photovoltaic cell itself.

As examples of other patents relating to improving the conversion efficiency of solar radiation, mention may be made of the following patents which represent but a cursory search and accordingly should not be taken as a complete survey of the art pertaining thereto.

U.S. Pat. No. 3,426,212 issued to Klaas on Feb. 4, 1969 discloses a radiation converter comprising at least two substantially parallel layers each comprising (a)

solid polymeric material that is substantially transparent at least in the near ultraviolet and visible regions of the spectrum, and (b) fluorescent substance, the layers containing different fluorescent substances and disposed in optical relationship and adjacent to each other. One object of the invention is said to be to convert radiant energy into chemical energy or into electrical energy by a process involving the production of fluorescence (stokes and/or anti-stokes), generally in a cascade system involving a plurality of fluorescent materials, and passage of the fluorescence into a chemical system or into a photocell or other radiation converter.

U.S. Pat. No. 3,929,510 issued to Kittl on Dec. 30, 1975 discloses a solar radiation conversion system having a silicon cell and solar radiation conversion means comprising ytterbium oxide and at least one other specified rare earth oxide. A specific object is said to be to provide a system having solar energy conversion means characterized by a band-emission spectrum that provides a good spectral match with the spectral response of a silicon cell.

U.S. Pat. No. 4,140,544 issued to Sill on Feb. 20, 1979 pertains to a luminescent photovoltaic device for converting solar or other light radiation to electrical energy, having a luminescent collector member with divergent upper and lower surfaces. These surfaces are divergent in at least that part or area of the collector where solar radiation enters the collector, the direction of divergence being selected to direct the internal surface angle of reflection of collected light energy toward one or more photovoltaic cells mounted on or coupled to one or more edge surfaces of the collector.

U.S. Pat. No. 4,155,371 issued to Wohlmut et al, on May 22, 1979 has as its objective to provide a new and improved luminescent solar collector which employs a plurality of different types of photovoltaic cells. The luminescent solar collector has a luminescent member with at least two types of photovoltaic cells, each type of cell operating efficiently for the generation of electricity over a wavelength range which is different from the efficient wavelength range of the other types of photovoltaic cells present on the luminescent member, each type of photovoltaic cell carrying intermediate to it and the luminescent member a filter means which allows only light within the efficient wavelength range for that type of photovoltaic cell to pass from the luminescent member into the photovoltaic cell.

U.S. Pat. No. 4,166,919 issued to Carlson on Sept. 4, 1979 discloses an amorphous silicon solar cell with a layer of high index of refraction material or a series of layers having high and low indices of refraction material deposited upon a transparent substrate to reflect light of energies greater than the bandgap energy of the amorphous silicon back into the solar cell and transmit solar radiation having an energy less than the bandgap energy of the amorphous silicon. The patent is directed to the problem caused by absorption of infrared radiation by the solar cell degrading the performance and shortening the useful life of the solar cell.

U.S. Pat. No. 4,190,465 issued to Boling on Feb. 26, 1980 discloses a luminescent solar collector comprising a relatively thick layer with a photocell coupled to a face surface thereof and at least one thin luminescent layer optically coupled to said thick layer, the thick layer having an index of refraction of at least 0.04 more than each of the luminescent layers and being at least 10 times as thick as the sum of all other layers of the collector. The invention is said to be an improvement in luminescent solar collectors and concentrators of a previously disclosed type.

U.S. Pat. No. 4,238,247 issued to Oster on Dec. 9, 1980 is concerned with the problem that photovoltaic cells actually utilize a very small portion of the solar energy incident thereon to produce electricity. One object of the patent is to provide a structure for the simultaneous conversion of solar energy to electricity and to thermal energy. This is said to be accomplished by means of a structure which in one apparatus converts a part of incident solar energy to electrical energy by the use of photocells mounted on a luminescent solar collector of tubular design while another portion of such incident energy is converted to thermal energy.

U.S. Pat. No. 4,395,582 issued to Damsker on July 26, 1983 relates to a combined solar converter which has a photovoltaic cell for converting the energy of solar radiation of a particular range of wavelengths to electricity and which has a thermal heat absorber spaced from the cell which converts solar radiation of longer wavelengths passing from the cell to useful heat. In the discussion of the Background Art, mention is made of the relatively narrow range of sensitivity which effectively converts only a small part of the energy to electricity. Consequently, it has previously been proposed to combine solar cells which are sensitive to different parts of the solar spectrum to increase the effective amount of the solar spectrum converted; or to utilize more of the solar spectrum for conversion purposes by shifting radiation of shorter wavelengths to longer wavelengths in order to come within the particular range of sensitivity for a particular cell.

Recently, luminescent solar concentrators (LSC) that make silicon photovoltaic cells more economical to use have been reported in the literature. Basically, an LSC consists of a sheet of transparent plastic permeated with several fluorescent dyes. The plate uses a combination of dyes to deliver reddish light to photovoltaic cells at its edge. When sunlight shines onto the plate, one group of dye molecules absorbs a much wider range of wavelengths of light than would normally be utilized by the photovoltaic silicon cells. These "donor" dyes transfer the energy to "acceptor" dyes within the plate which re-emit the light at the narrow wavelength band that photovoltaic cells use most efficiently. However, it is believed that the dyes need to be stable for 10-20 years if luminescent collectors are to be practical. (See, for example, "Chemical Week", Aug. 25, 1982, page 66, McGraw-Hill, Inc.)

While not intended to be a complete prior art survey, the above citations will illustrate the various approaches that have been or may be taken to increase the efficiency of photovoltaic devices, particularly silicon solar cells. While progress has been made since the early '70's, there is still a great need for modifying the spectral match of the electromagnetic radiation, e.g. solar energy, to the response of the cell, particularly so that the energy at the lower end of the spectrum, e.g. UV, may be utilized.

It is to the latter problem that this invention is directed.

Thus, broadly speaking, the task of the invention can be said to be to provide luminescent materials which can be employed to absorb radiation at the lower wavelength end of the spectrum which cannot be utilized by the photovoltaic cell, but which then emit light at a longer wavelength to which the cell is responsive for conversion to electrical energy. However, since the solution to this task, broadly speaking, is old, the task may be said to be to provide for this purpose luminescent materials which, because of their properties, are particularly suited for this conversion of radiation, e.g. do not have an overlap between absorption and emission which can lower efficiency, have a strong emission at the desired wavelength, are highly stable, and can be synthesized easily and inexpensively.

BRIEF DESCRIPTION OF THE INVENTION

In accordance with the present invention the aforementioned task is solved by the use of a known class of anthracene dimer derivatives reported in the literature as "lepidopterenes". Accordingly, the essence of the present invention is the concept of providing a layer of a lepidopterene between the source of radiation such as sunlight and a photovoltaic cell, e.g. a silicon cell, in order to increase the efficiency of the cell in converting this radiation to electrical energy. The layer of lepidopterene can be applied as a coating to the photovoltaic cell or it may be disposed in a separate element in association with the cell.

DETAILED DESCRIPTION OF THE INVENTION

It is known that a photovoltaic semiconductor P-N junction can convert to electricity only that portion of the incident photon energy spectrum, typically solar radiation, which creates hole-electron pairs within a given semiconductor material. For example, in a silicon photovoltaic cell only that portion of the solar spectrum with energy in the vicinity of the 1.1 electron volts per photon and which exceeds the band-gap energy of silicon is converted into electricity. Photons of lesser energy do not generate electricity. To maximize the efficiency of a given photovoltaic cell, it is advantageous to convert as much of the available light as possible into an energy range to which the cell can respond in the generation of electricity.

One technique known in the art for achieving such conversion takes advantage of the fact that light falling upon a luminescent agent is characteristically reradiated or emitted in a narrow band of wavelengths of known energy content. There are, however, problems in finding a luminescent agent having the desired properties. The optimum luminescent agent for converting radiation at the lower wavelength to which the photovoltaic cell is not responsive to a higher wavelength which can be utilized to provide electrical energy will absorb radiation at this lower radiation and emit light at a wavelength at or just slightly shorter than the band gap of the cell employed. It is important to the efficiency of the system that the luminescent agent not absorb the emitted light at all (or, at least, minimally). Other factors which need be considered of course include the stability of the luminescent agent. For instance, it must not degrade in sunlight so as to interfere with the operation of the device during its contemplated useful life, form decomposition products which could be harmful to the luminescent agents themselves, etc. Of course, they should ideally be relatively inexpensive and easily manufactured.

In accordance with the present invention a class of luminescent reagents known as lepidopterenes are employed with the aforementioned photovoltaic cells to provide the advantageous results described above.

Figure 1:
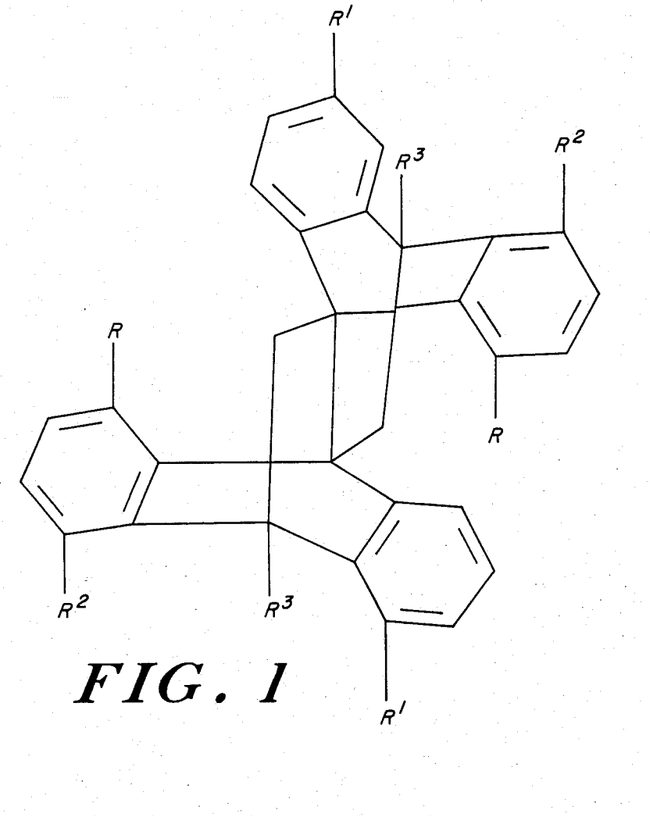
FIG. 1 is the structural formula of illustrative lepidopterenes contemplated by this invention.

"Lepidopterenes" are a class of anthracene dimer derivatives of the general formula illustrated in FIG. 1. While the origin of the name is obscure, as is the originator, the name is very appropriate, since it is obviously derived from "lepidoptera", a class of insects, including butterflies, which have four brightly colored wings.

An article by Felix et al, appearing in "Tetrahedron Lett." (6), 409–412 (1975) as reported in CA:83, 9603v (1975) reports the synthesis of the parent ($R^3=H$) and its dimethyl derivative ($R^3=CH_3$). According to "Acta Crystallogr., Sect. B", B 32(4), 1220–3 (Fr.) (1976), reported in CA:84, 187896w (1976), x-ray structural analysis shows that the colorless by-product obtained from the reactions of peroxides with 9-methylanthracene or Grignard reagents with 9-halogenmethylanthracenes is a new tetracyclic hydrocarbon called lepidopterene, a name suggested by its structure. CA:89, 50948y (1978), referring to a paper by Becker et al in "Chem. Phys.Lett.", 55(3), 498–502 (1978) entitled "On the relationship between fluorescence and molecular geometry. Formation of a luminescent intramolecular anthracene-ethylene exciplex by electronic excitation of lepidopterene", discloses that the electronic excitation of the bridged benzenoid hydrocarbon lepidopterene (L) in the crystalline state and in solution gives rise to an anomalous luminescence which is attributed to the radiative deactivation of an intramolecular anthracene-ethylene exciplex E*. The formation of E* and the regeneration of L are discussed in terms of a geometry-dependent reversible [4+2] cycloaddition. Relevant quantum yield data are presented in an energy level diagram. In a later paper by Becker et al in "Chem. Phys.Lett." 77(2), 246–52 (1981) reported in CA:95, 23825y, disclosure is made of photolytic cycloversion of substituted lepidopterenes of the formula shown in FIG. 1 wherein R, $R^1$, $R^2$=H, Cl; $R^3$=H, Me, Et, Bu, Ph, alpha-naththyl methyl, styryl. Finally, a paper by Becker, et al in "J.Org.Chem.", 1336–8(1979) discloses the preparation of lepidopterene and dimethyl-lepidopterene.

While lepidopterenes are known, as evidenced by the above citations, their usefulness in photovoltaic devices has never heretofore been disclosed. The essence of this invention, accordingly, resides in the discovery that they are surprisingly good luminescent agents for this usage.

Photoexcitation of lepidopterene has been found to give rise to formation of the electronically excited cycloreversion exciplex product E* whose deactivation is associated with very strong emission ($\Phi F > 60\%$) around 600nm, an optimal wavelength for conversion to electrical energy by the cell. Since the maximum absorption ($\lambda_{max}$) for lepidopterence is around 275 nm, there is no overlap between the absorption (~275) and the emission (~600). Since the overall efficiency of a luminescent material for converting "useless" radiation to "useful" radiation with a photovoltaic cell is in part a function of the luminescent quantum yield ($\Phi F$), which efficiency would not be lowered by any spectral overlap of absorption and emission (which leads to reabsorption problems) it was theorized that these compounds would be especialy suitable for use in photovoltaic cells, particularly when one considers the fact that it is almost impossible to find a dye with a large stokes shift (energy difference between absorption and emission). Subsequent experimentation confirmed the efficacy of this theoretical consideration.

In the photoexcitation of lepidopterene, giving rise to a red-shifted structureless emission, the prominent emission occurs from the cycloreversion product of exciplex geometry according to the following equations:

tems. In fact, the relative yield of the red exciplex emission is increased relative to the blue anthracene fluorescence These results indicate that the activation energy from the [E*] to [A*] may be increased in the solid state. Furthermore, the increase of the activation barrier should be beneficial in the overall stability of the molecule, since the pathway to the valence isomer compound [A] is partially limited. The exciplex emission has been shifted from 600$_{nm}$ to 575$_{nm}$.

Following these initial observations, experiments were then conducted comparing the photocurrent action spectrum of a photovoltaic cell having: (1) no luminescent material; (2) a thin surface coating of lepidopterene (e.g. on the order of 0.16 mgs/cm$^2$ of dye); and (3) a thicker surface coating of lepidopterene (e.g. on the order of 0.16 mgs/cm$^2$). In each instance the coating composition comprised a 50—50 mixture by weight of dye and PMMA matrix material. The measurement was made for a standard silicon photovoltaic cell using the Initial experimentations were focused on assessing the feasibility of improving the ultraviolet and blue sensitivity of silicon photovoltaic devices, using the parent compound, lepidopterene (R, R$^1$, R$^2$, and R$^3$=H).

Figure 3:
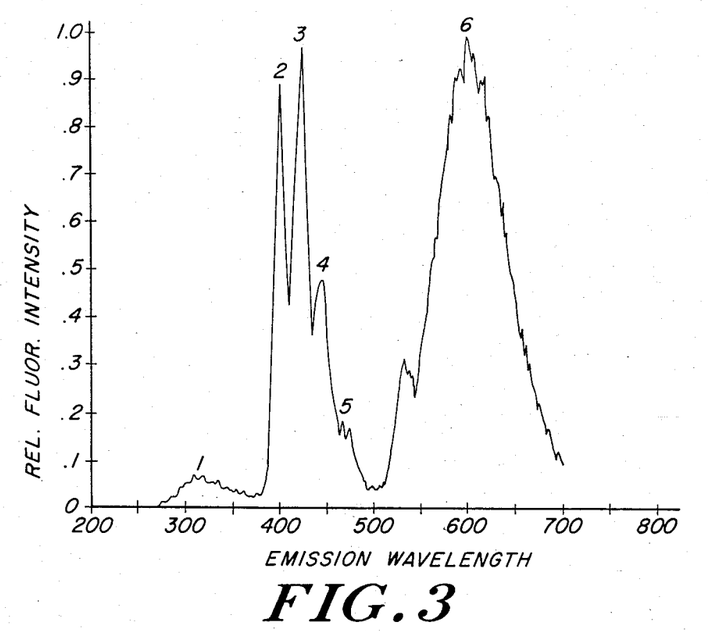
FIG. 3 is a graph showing the emission spectrum in solution of a luminescent material according to this invention.

The emission spectra in solution vs. solid state film were first studied. FIG. 3 shows the emission spectrum of lepidopterene in tetrahydrofuran solution (THF). Both the blue anthracene emission, [E*], $\lambda_{max}$ ~420$_{nm}$ and the red exciplex emission, [E*], $\lambda_{max}$ ~600$_{nm}$ can be observed. To study solid state emission, lepidopterene was next incorporated into a polymethylmethacrylate (PMMA) matrix. The emission of this PMMA film is shown in FIG. 4.

Figure 4:
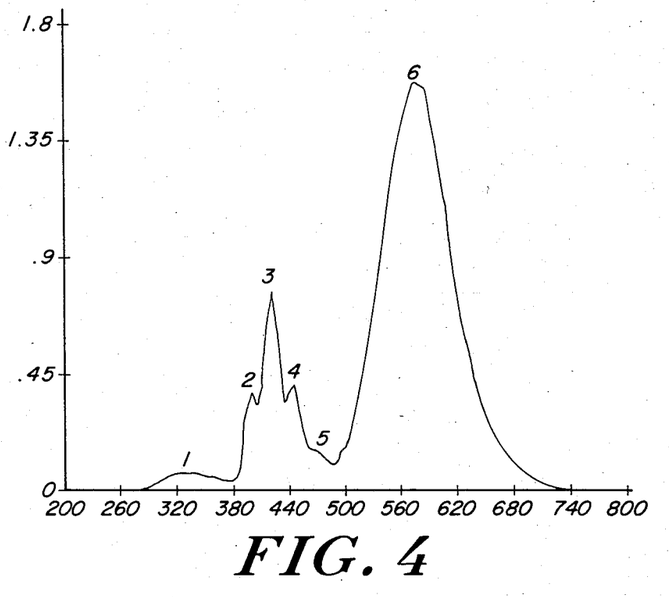
FIG. 4 is a similar graph showing its emission spectrum incorporated in a film.
Figure 5:
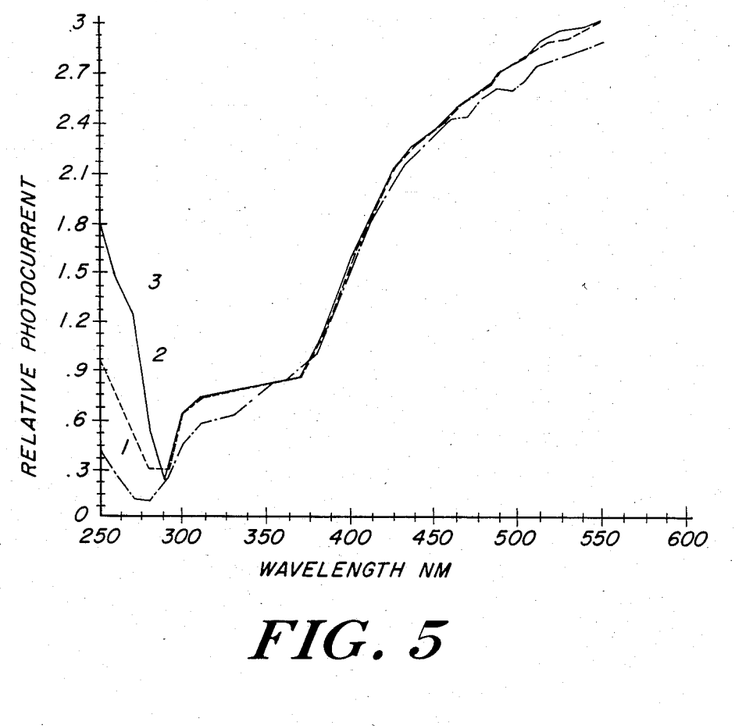
FIG. 5 is a graph comparing action spectrum of a cell having no luminescent material with cells having a thin and a thick coating of a luminescent material in accordance with this invention.

Comparison of the respective spectra from FIGS. 3 and 4 indicates that the red exciplex emission is not quenched in a solid state film, an occurrence which would preclude their utility in the contemplated sys- Spex Fluorolog Emission Spectrometer where the source intensity was monitored with a Rhodamine B quantum counter. The results are shown in FIG. 5. This figure shows action spectra for the silicon cell from 250 nm to 600 nm which is the upper limit for the quantum counter. A clear photocurrent increase is observed in the wavelength region below 290 nm where lepidopterene absorbs. Since the experiment was run in the laboratory with laboratory coatings and equipment, it is postulated that refinements in coating techniques and an optimization of the surface film characteristics, as would be done, for example, with the more sophisticated production run techniques and equipment would permit further increase of the collection factor (representing the fraction of the emitted light which can be harvested).

Figure 6:
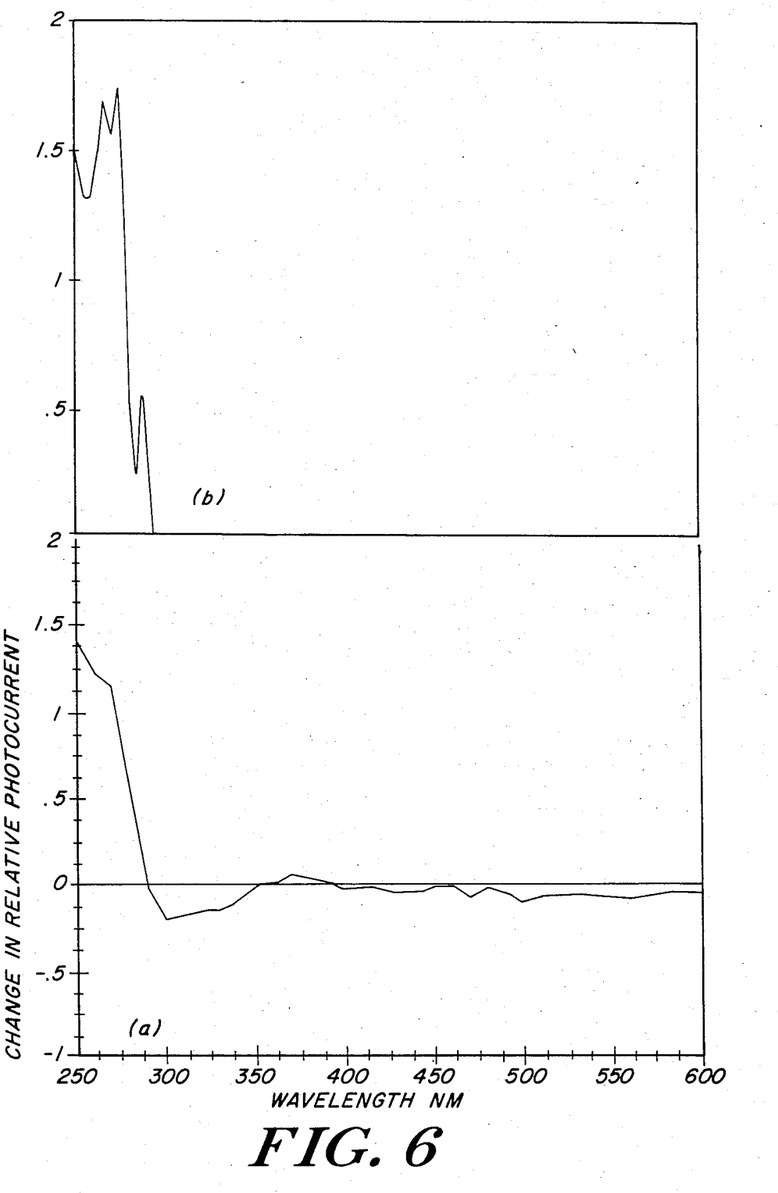
FIG. 6 is a graph demonstrating a plot of the increase in photocurrent vs. wavelength obtained according to this invention.

In order to establish that the above-noted increase in the UV photocurrent was in fact due to the PMMA coating of the lepidopterene, the change in relative photocurrent vs. wavelength was monitored. FIG. 6(a) shows the excitation spectrum for the 575 nm exciplex emission, and FIG. 6(b) demonstrates a plot of the increase in photocurrent vs. wavelength. The near agreement between the two plots demonstrates the expected behavior of the system.

The aforementioned experimentation unequivocally establishes that the class of anthracene diners known as lepidopterenes can materially improve the sensitivity of silicon photovoltaic cells. While they were run with the simplest or basic (unsubstituted) one, substitution with various auxochromes may advantageously shift the ground state absorption spectrum to higher wavelengths such as 350-400 nm.

In this context, there are some basic rules which govern the substituent effects on emission. For example, substituents which are conjugative electron donors usually increase the total fluorescence yield of an aromatic system as based on the increased radiative transition probabiities. Substituents such as —OH, —OCH$_3$, —OC$_2$H$_5$, —NH$_2$, —CN, etc., increase intensity of fluorescence.

Accordingly, the present invention is not restricted to lepidopterene itself but includes within its scope substituted derivatives thereof. The term "a lepidopterene" as used in the appended claims defining the scope of the invention signifies lepidopterene itself or any derivatives thereof, e.g. containing the aforementioned substituents, which function in the intended way to absorb radiation of a low wavelength to which the photovoltaic cell is not responsive and to emit radiation at a higher wavelength to which it is responsive.

The photovoltaic cells to which this invention is applicable include any of the per se known ones. The layer of lepidopterene may be an integral part of the cell, i.e. applied thereto as a coating, or it may be contained in a separate element positioned between the cell and the light source.

Figure 2:
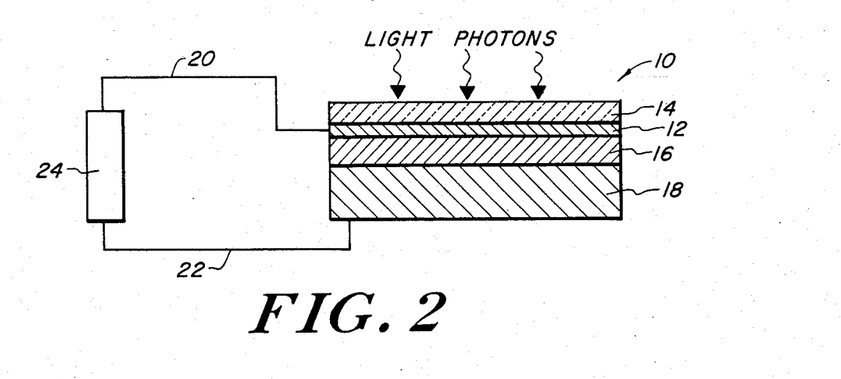
FIG. 2 is a schematic illustration of one form of photovoltaic cell as contemplated by the invention.

FIG. 2 illustrates a typical voltaic cell, the lepidopterene having been applied as a coating forming an integral layer of the cell system. As shown therein, the cell 10, positioned in the path of light photons, including UV light, comprises a layer of a lepidopterene 14; a transparent electrode 12; a silicon semiconductor layer 16; a conducting base electrode 18; and leads 20, 22 connecting transparent electrode 12 and conducting base electrode 18, respectively, to a load 24.

The lepidopterene in layer 14 may be disposed in any of the known innocuous transparent polymeric matrices, e.g. the aforementioned PMMA. By "innocuous" is meant any matrix material which will not interreact adversely with the lepidopterene and is compatible with the system and will not adversely affect its useful light.

The remaining elements in the schematic sketch of FIG. 2 are well known and need not be discussed in any further detail.

The following examples illustrate the preparation of lepidopterenes contemplated by this invention.

EXAMPLE 1

Preparation of Lepidopterene 9-(bromomethyl)anthracene (4 gm., 14.8 mmoles) was dissolved in 200 ml. of dioxane at 70° C. under nitrogen. With the addition of powdered stannous chloride dihydrate (3.2 gm., 14 mmoles), the solution turned orange brown. Coloration faded in a few minutes and the reaction mixture was allowed to stand at 70° C. for another half hour and then was diluted with an equal volume of methanol. The crude yellow-green precipitate was filtered and then dissolved in methylene chloride and the methylene chloride solution filtered to remove undissolved material. The solution was decolored and the lepidopterene reprecipitated from the methylene chloride solution by the addition of methanol to obtain 1 gm. (2.6 mmoles) of the colorless, crystalline solid (18% yield).

EXAMPLE 2

Preparation of Dimethyl Lepidopterene 9-methyl anthracene was reacted with formalin and HCl in glacial acetic acid to produce the starting material 9-(chloromethyl)-10-methylanthracene (0.44 gms). The 9-(chloromethyl-10-methyl anthracene (0.44 gms.) was dissolved in 10 mls of dioxane with heating to 70° C. Stannous chloride dihydrate (0.412 gms) was added and the mixture was reacted with stirring at 70° C. for 40 minutes under nitrogen gas. The reaction was then cooled and the solution quenched with methanol. The solution was filtered to remove the methyl lepidopterene. This solid was then redissolved in methylene chloride and filtered to remove any insoluble material. The methylene chloride solution of the lepidopterene was quenched with methanol to precipitate the lepidopterene and filtered to remove the material. 0.2 grams of a colorless, crystalline solid were obtained. (See also H.-D. Becker, *J.Org.Chem.*, 44, 1337(1979)

To recapitulate, the present invention contemplates the use of lepidopterenes, a per se known class of luminescent compounds, to increase the efficiency of photovoltaic devices, e.g. a cell such as is illustrated in FIG. 2. For purposes of illustration, certain lepidopterenes contemplated by this invention have been shown in FIG. 1 and described in the foregoing description of the specification, including the parent (unsubstituted) and methyl-substituted derivative whose preparations are described in the foregoing examples. However, as stated, the invention is not limited to the disclosed species, but instead contemplates the use of lepidopterenes in general which function in the intended manner to absorb radiation of a low wavelength to which the cell is not responsive and to emit radiation at a higher wavelength to which it is responsive.

While for purposes of illustration, the lepidopterene has been shown in the drawings (i.e. FIG. 2) as being contained in a layer as an integral part of the cell, as previously mentioned it can, alternatively, be present as a separate element. In the latter instance, it will be appreciated that this separate element will, in its simplest form, comprise a layer of lepidopterene in a polymeric matrix carried on a transparent, dimensionally stable support material, e.g. a cellulosic material or a polyester such as polyethylene terephthalate, which support materials are well known and commercially available.

Since certain changes may be made without departing from the scope of the invention herein involved, it is intended that all matter contained herein or shown in the accompanying drawings shall be interpreted as illustrative and not in a limited sense.

What is claimed is:

1. In a product comprising a photovoltaic cell including a luminescent dye which will absorb radiation at a wavelength to which the cell is not significantly responsive and emit radiation at a higher wavelength at which it is responsive;

the improvement wherein said dye comprises a lepidopterene.

2. A product as defined in claim 1 wherein said cell is a silicon cell.

3. A product as defined in claim 2 wherein said lepidopterene is a compound of the formula shown in FIG. 1 wherein each of R, $R^1$ and $R^2$ is selected from the group consisting of hydrogen and chlorine; and $R^3$ is selected from the group consisting of hydrogen, methyl, ethyl, butyl, phenyl, alpha-naphthyl methyl and styryl.

4. A product as defined in claim 1 wherein said lepidopterene contains a substituent increasing the intensity of fluorescence.

5. A product as defined in claim 4 wherein said substituent is selected from the group consisting of methoxy, ethoxy, amino, and cyano.

6. A product as defined in claim 1 or 2 wherein said lepidopterene is contained in a layer as an integral component of said cell.

7. A product as defined in claim 1 or 2 wherein said lepidopterene is contained in a separate element disposed between said cell and a source for the radiant energy to be converted by said cell to electrical energy.

8. A product as defined in claim 1 or 2 wherein said lepidopterene absorbs radiation below about 290 nm.

9. A product as defined in claim 8 wherein the luminescent quantum yield of emission of said lepidopterene is greater than 60% at about 600 nm.

10. In a method for improving the efficiency of a photovoltaic cell wherein a luminescent dye which will absorb radiation at a wavelength to which the cell is not significantly responsive and emit radiation at a higher wavelength at which it is responsive, is disposed between said cell and the source of said radiation;

the improvement wherein said dye comprises a lepidopterene.

11. A method as defined in claim 10 wherein said dye is contained in a layer as an integral component of said cell.

12. A method as defined in claim 10 wherein said dye is contained in a separate element.

* * * * *